United States Patent [19]

Niederreiter

[11] Patent Number: 4,985,818

[45] Date of Patent: Jan. 15, 1991

[54] DC VOLTAGE CONVERTER WITH FORMATION OF THE ACTUAL CURRENT VALUE

[75] Inventor: Hans Niederreiter, Massing, Fed. Rep. of Germany

[73] Assignee: Siemens Aktiengesellschaft, Berlin and Munich, Fed. Rep. of Germany

[21] Appl. No.: 545,922

[22] Filed: Jun. 29, 1990

[30] Foreign Application Priority Data

Jun. 30, 1989 [EP] European Pat. Off. ........ 89111982.8

[51] Int. Cl.⁵ ............................................. H02M 3/335
[52] U.S. Cl. .................................... 363/19; 361/93; 361/98; 361/110; 363/21
[58] Field of Search ...................... 363/18, 19, 22, 23, 363/97, 131, 133, 21, 56; 361/110, 98, 94, 93

[56] References Cited

U.S. PATENT DOCUMENTS

| | | | |
|---|---|---|---|
| 3,403,320 | 9/1968 | Whitman | 361/93 |
| 3,875,516 | 4/1975 | Thomas | 328/146 |
| 4,453,193 | 6/1984 | Huang et al. | 361/93 |
| 4,952,819 | 8/1990 | Herrmann | 307/571 |

FOREIGN PATENT DOCUMENTS

| | | |
|---|---|---|
| 2838009 | 1/1980 | Fed. Rep. of Germany . |
| 56-148178 | 4/1980 | Japan . |
| 59-44973 | 3/1982 | Japan . |

Primary Examiner—Beha, Jr., William H.
Assistant Examiner—Bruce Dunn
Attorney, Agent, or Firm—Hill, Van Santen, Steadman & Simpson

[57] ABSTRACT

An autoconverter has an electronic switch activated by turn-on pulses and a circuit arrangement for the formation of the actual value of the current in a primary input circuit. Inrush currents are suppressed within an optimally-broad range of current by providing an electronic switch in the circuit arrangement which forms the actual value of the current, the electronic switch being inhibited during initial power peaks of the current flowing through a current sensor in the primary input circuit.

8 Claims, 3 Drawing Sheets

DC VOLTAGE CONVERTER WITH FORMATION OF THE ACTUAL CURRENT VALUE

BACKGROUND OF THE INVENTION

1. Field of the Invention

The present invention relates to a DC voltage converter having a circuit arrangement for the formation of the actual value of the current and which has an electronic switch arranged in a main power circuit of a DC voltage converter and a current sensor arranged in series with the electronic switch and traversed by ramp-shaped current pulses, whereby the electronic switch has a control input connected to a control output of a control circuit that has an input connected to the output of the circuit arrangement for the formation of the actual value of the current and controls the repetition rate and/or the pulse duty factor of the current pulses output at its control output dependent on the actual value of the current in that the chronologically-rising, momentary value of the ramp-shaped current pulse is compared to a reference value.

2. Description of the Prior Art

A DC voltage converter of the type generally set forth above is disclosed in the German application No. 28 38 009. In this known DC voltage changer a switching transistor is driven by a clock generator with turn-on pulses having a constant operating frequency. In order to regulate the output voltage, the pulse duty factor, i.e. the quotient of the on time of the power switching transistor to the duration of the period, is varied. Given overload at the output of the autoconverter, the current in the power circuit is limited for protecting the components. This is achieved by lowering the output voltage at an admissible output current by shortening the on time. The switching transistor is thereby inhibited as soon as the measured momentary value of the current flowing through the switching transistor exceeds a prescribed limit value.

To this end, the known DC voltage converter contains a current-limiting circuit having a current transformer as a current sensor. This current sensor is followed by an RC filter as a low-pass filter, so that the load voltage is freed of inrush currents. This prevents the inhibiting of the switching transistor from being erroneously and prematurely triggered by the inrush currents.

However, the RC filter can only be optimally dimensioned for a defined current. The utilization of such a low-pass filter therefore leads to a desired result only given comparatively small current ranges.

SUMMARY OF THE INVENTION

It is an object of the invention to provide an improved circuit arrangement for forming the actual value of the current of a DC voltage converter of the type generally set forth above such that inrush currents of the current pulses flowing through the current sensor are suppressed with an optimally large range of current in the formation of the actual value of the current.

A perception within the framework of the invention is that the duration of the initial power peaks is practically independent of the power load of the DC voltage converter given switching DC voltage converter of the type generally set forth above.

Proceeding on the basis of the above perception, the DC voltage converter constructed in accordance with the present invention is fashioned in a manner such that it is particularly characterized in that the circuit arrangement for forming the actual value of the current contains an electronic switch arranged between the current sensor and its output, in that the electronic switch of the circuit arrangement for forming the actual value of the current can be controlled such that, dependent on the turn-on phase of the electronic switch arranged in the main power circuit, it inhibits during the inrush current of the current flowing through the current sensor and is conductive during the remaining time of the current pulse. An accurate limitation of the current in an especially broad range advantageously results on the basis of the measures taken in practicing the present invention. This is of particular advantage when a current within a broad operating range is to be regulated or when a current limitation is to be set within a broad range.

The switching DC voltage converter can be fashioned such that the electronic switch arranged in the main power circuit and the electronic switch of the circuit arrangement for forming the actual value of the current are driven in the stated manner for a common control circuit. When the DC voltage converter is constructed such that it is particularly characterized in that a delay element is provided between the control input of the electronic switch of the circuit arrangement for forming the actual value of the currents and the output of the control circuit, the common control circuit need comprise only one output for the electronic switch arranged in the main power circuit of the DC voltage converter.

According to a particular feature of the invention, the DC voltage converter is particularly characterized in that, given a construction of the electronic switch arranged in the main power circuit as a field-effect transistor, the delay element is composed of an ohmic resistor preceding the control electrode of the field-effect transistor and the gate-source capacitance of the field-effect transistor. Advantageously and resulting therefrom is that the gate-source capacitance of the field-effect transistor serving as the electronic switch is a component of the delay element.

According to another feature of the invention, the DC voltage converter is particularly characterized in that, given a fashioning of the electronic switch arranged in the main power circuit as a field-effect transistor, the delay element is composed of an ohmic resistor preceding the control electrode of the field effect transistor and of the gate-source capacitance of the field-effect transistor and of a capacitor arranged in parallel therewith. With this structure, the capacitance can be supplemented by an additional capacitor such that an optimum delay occurs.

A particularly low influence of the control pulses on the measured current value results according to another feature of the invention wherein the DC voltage converter is further particularly characterized in that a resistor that is of low impedance in comparison to the resistor of the delay element is arranged at the output of the circuit arrangement for forming the actual value of the current.

An expedient connection of the source electrode of the field-effect transistor contained in the circuit arrangement for forming the actual value of the current to the source electrode of the field-effect transistor arranged in the main power circuit is achieved according to another feature of the invention in which the DC voltage converter is further particularly characterized in that the further resistor is a high-impedance resistor in comparison to the resistor of the activated electronic switch of the circuit arrangement for the formation of the actual value of the current.

According to another feature of the invention, the DC voltage converter is particularly characterized in that, given a fashioning of the DC voltage converter as a push-pull circuit, the electronic switch arranged in the main power circuit is connected to the current sensor together with a further electronic switch that lies in a further arm of the main power circuit, and in that the control inputs of the two electronic switches of the main power circuit are each connected via a respective delay element to the control input of the electronic switch of the circuit arrangement for the formation of the actual value of the current.

A particularly low influence of the capacitance of the electronic switch of the circuit arrangement for forming the actual value of the current on the measured current value results according to another feature of the invention in which the DC voltage converter is particularly characterized in that a capacitor is arranged parallel to the output of the circuit arrangement for forming the actual value of the current. In particular, the capacitance is thereby dimensioned so small that the RC element formed by the resistor of the closed electronic switch and the capacitor has a negligible influence on the output voltage of the circuit arrangement for forming the actual value of the current.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
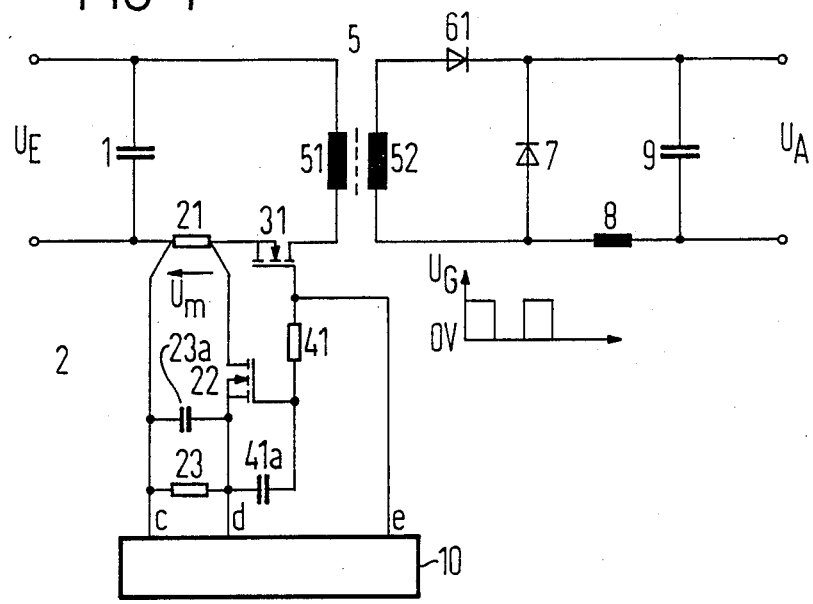
FIG. 1 is a schematic circuit diagram of a DC voltage converter constructed for single-phase operation and having a circuit arrangement for forming the actual value of the current.

Referring to FIG. 1, a single-phase forward frequency converter is illustrated comprising an input voltage $U_e$ connected across a capacitor 1 and an output voltage $U_a$ taken across a capacitor 9. A series circuit formed of the primary winding 51 of the transformer 5, the source-drain path of a field-effect transistor 31 and a shunt resistor 21 is connected in parallel with the capacitor 1. A rectifier diode 61 is connected between the secondary winding 52 of the transformer 5 and the capacitor 9. A free-wheeling diode 7 is arranged in a shunt arm following the rectifier diode 61. An inductor 8 is connected in a series arm between the free-wheeling diode 7 and the capacitor 9. A current transformer can potentially be employed as a current sensor instead of the shunt resistor 21.

The control electrode of the field effect transistor 31 is connected to an output e of a control circuit 10. The measured value input c, d of the control circuit 10 lies at the output of a circuit arrangement 2 for forming the actual value of the current. That terminal of the current sensor 21 directly connected to the field-effect transistor 31 is conducted via the drain-source path of the field effect transistor 22 to a terminal d of the actual value input of the control circuit 10. The other terminal of the current sensor 21 is directly connected to the terminal c. The parallel circuit composed of a resistor 23 and of a capacitor 23a lies parallel to the input c, d. The capacitor 23a can be omitted when the influence of the effective drain-source capacitance of the field-effect transistor 22 is negligibly low.

The control electrode of the field-effect transistor 22 is connected via a resistor 41 to a control electrode 31 of the field-effect transistor 31. A capacitor 41a lies parallel to the gate-source path of the field-effect transistor 22.

Figure 3:
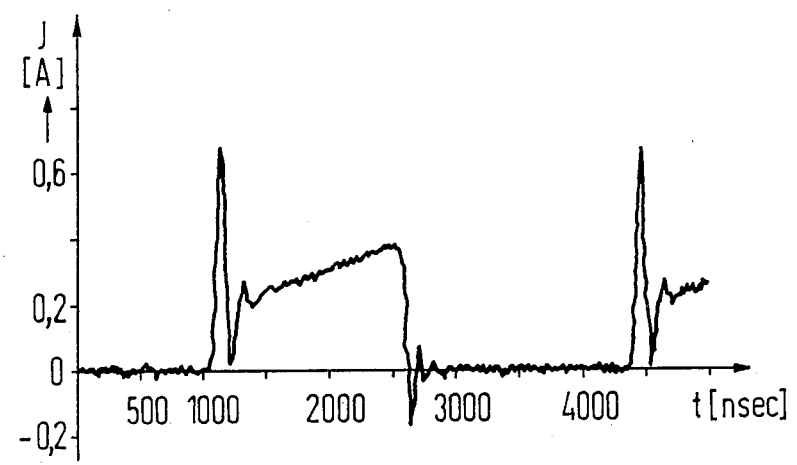
FIG. 3 is a graphic illustration showing the chronological curve of a current pulse with superimposed inrush currents.

In the single-phase forward frequency converter of FIG. 1, the current in the primary circuit rises ramp-shaped during the on time of the primary power semiconductor formed by the field-effect transistor 31. This current is converted into a voltage $U_m$ by the shunt formed by the resistor 21 and is used in the control circuit 10 as an actual value of the current for current limitation and/or current mode regulation. An unavoidable inrush current, as shown by way of example in FIG. 3, is superimposed on the primary side and/or on the secondary side of the DC converter due to capacitances and inhibit delays of other participating power semiconductors. These inrush currents would considerably disturb the further processing of the measured signal. It is suppressed with the assistance of the circuit arrangement illustrated in FIG. 1 without significantly changing the further course of the signal.

Figure 4:
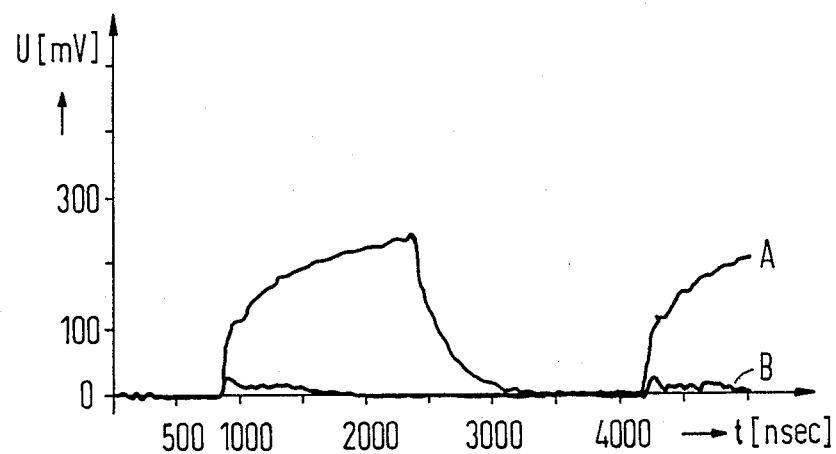
FIG. 4 is a graphic illustration showing the chronological curve of a test voltage given traditional low-pass filtering with currents of differing size.

In comparible DC voltage converters of a known type, the inrush current is suppressed with the assistance of a low-pass filter or, respectively, RC filter. As results from the comparison of FIG. 4, the curve A for high current and the curve B for a low current, this leads to considerable falsifications of the measured signal given broader current ranges since the RC element can be optimally dimensioned only for a defined current.

Figure 5:
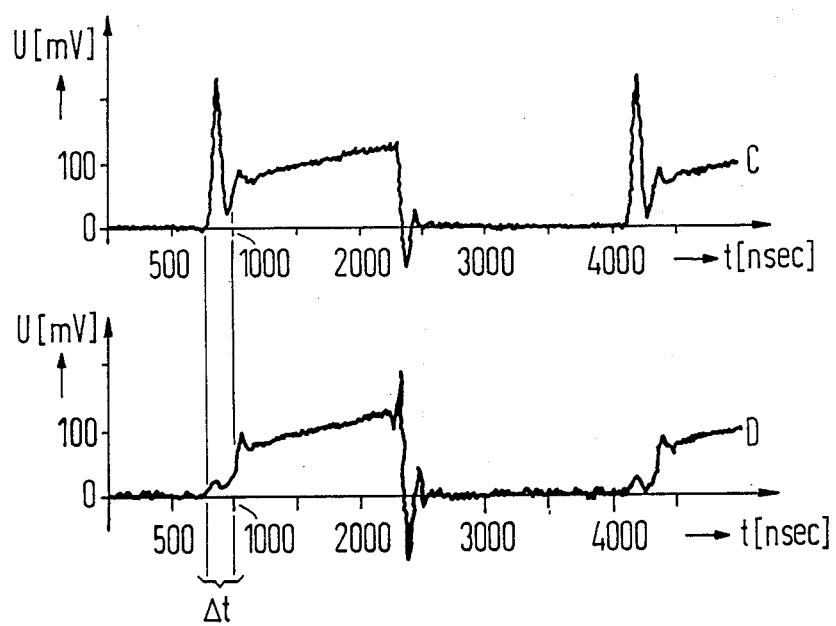
FIG. 5 is a graphic illustration showing a measured signal at the current sensor and a measured signal at the output of the circuit arrangement for forming the actual value of the current compared to one another.

Given the DC voltage converter of FIG. 1, the measured signal is separated from the control circuit 10 with a switch device during the duration of the initial power peaks. During the remaining time of the duration of the current flux, by contrast, the signal is fully connected through and is thus practically free of error. Curve c of FIG. 5 shows a measured signal before the switch device and the curve D therein shows a measured signal after the switch device.

According to FIG. 1, an electronic switch that is connected through with the turn-on signal of the power switch of the primary circuit, but delayed by a time $\Delta t$ serves a switch device that keeps the measured signal away from the control circuit 10 during the inrush currents.

The electronic switch is an MOS field-effect transistor 22 that is driven via the resistor 41 with the gate voltage $U_g$ of the power transistor 31. The time delay results from the resistor 41 and the capacitance of the parallel circuit composed of a gate capacitance of the field-effect transistor and the capacitor 41a.

If necessary, the capacitor 41a can be omitted, so that only the gate capacitance of the field-effect transistor 22 is effective as a capacitance in the delay element.

The resistor 23 is a low-impedance resistor compared to the resistor 41 and serves the purpose of the potential-associated connection of the source of the field-effect transistor 22 to the source of the field-effect transistor 31. So that the measured signal $U_n$ is not significantly falsified, the resistor 23 is advantageously a high-impedance element in comparison to the value $R_{ds}$ of the field-effect transistor 22.

Figure 2:
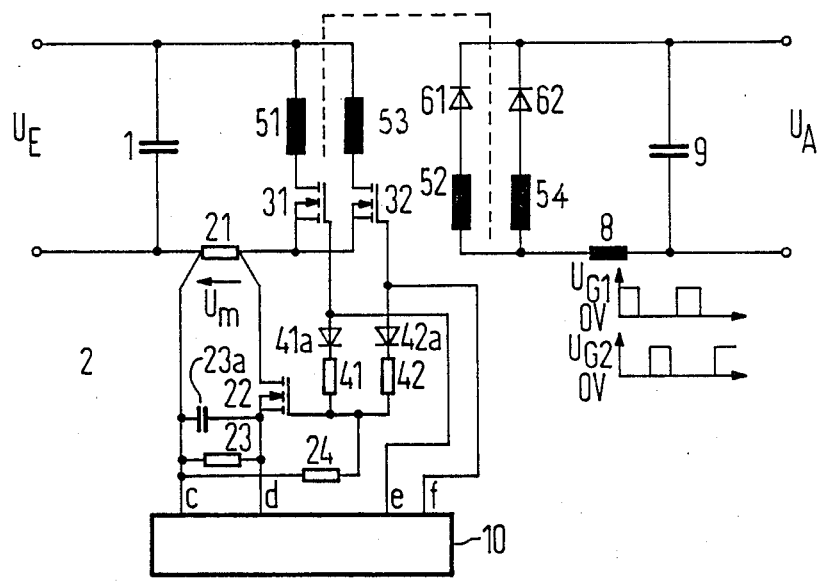
FIG. 2 is a schematic circuit diagram of a DC voltage converter constructed in accordance with push-pull technology and having a circuit arrangement for the formation of the actual value of the current.

FIG. 2 illustrates a forward frequency converter constructed in push-pull circuitry, whereby the field-effect transistor 22 that through connects the measured signal to the control circuit 10 or keeps the inrush currents away from the control circuit 10 is controlled by the turn-on signals of two power switches of the push-pull converter.

This push-pull converter differs from the single-phase converter of FIG. 1 in that a further series circuit is composed of a further primary winding 53 of the transformer 5 and of a further field-effect transistor 32 arranged parallel to the series circuit composed of the primary winding 51 and of the drain-source path of the field-effect transistor 31. Moreover, the further series circuit composed of the further secondary winding 54 and of a further rectifier diode 62 is arranged parallel to the series circuit composed of the secondary winding 52 and the rectifier diode 61. A further difference is that the push-pull converter need not contain a free-wheeling diode.

The circuit arrangement 2' for forming the actual value of the current according to FIG. 2 differs from the circuit arrangement 2 according to FIG. 1 only in that the control electrode of the field-effect transistor 22 is connected via an additional resistor 42 and an additional diode 42a lying in series therewith, to the control electrode of an additional field effect transistor 32 that is connected to a further control output f of the control circuit 10, and in that the diode 41a is in series with the resistor 41, and that the control electrode of the field-effect transistor 22 is conducted via the resistor 24 to one of the output terminals of the circuit arrangement 2'. The diodes 41a and 42a can be replaced by connections and the resistor 24 can be omitted when half the control voltage of the field-effect transistors 31 and 32 suffices as control voltage for the field-effect transistor 22. Just as in FIG. 1, a capacitor 41a can be arranged parallel to the gate-source path of the field-effect transistor 22.

FIGS. 1 and 2 respectively illustrate autoconverters. The described suppression of the inrush currents, however, can be correspondingly employed in other, clocked power supply devices, particularly in blocking converters.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a switching DC voltage converter of the type having formation of the actual value of a current, in which a main power circuit comprises a first electronic switch and a current sensor in series therewith and traversed by ramp-shaped current pulses, the first electronic switch includes a control input connected to a control output of a control circuit that has a control input connected to the output of the circuit arrangement that forms the actual value of the current and controls the repetition rate and pulse duty factor of current pulses at its control output dependent on the actual value of the current in that the rising, momentary value of the ramp-shaped current pulse is compared to a reference value, the improvement therein comprising:
    a second electronic switch in the circuit arrangement for forming the actual value connected between said current sensor and the output of said current arrangement, said second electronic switch including a control input connected to the output of the control circuit and controlled, dependent on the current-on pulse of the first electronic switch, to inhibit during current inrush of the current flowing through said current sensor and to conduct during the remaining time of the current pulse.

2. The improved switching DC voltage converter of claim 1, and further comprising:
    delay means connected between the output of the control circuit and said control input of said second electronic switch.

3. The improved switching DC voltage converter of claim 2, wherein:
    said first electronic switch is a field-effect transistor including a control electrode and a gate-source path; and
    said delay means comprises a resistor connected to said control electrode, and the gate-source capacitance of said field-effect transistor.

4. The improved switching DC voltage converter of claim 2, wherein:
    said first electronic switch comprises a field-effect transistor including a control electrode and a gate-source path; and
    said delay means comprises a resistor connected to said control electrode, the gate-source capacitance of said field-effect transistor, and a capacitor connected in parallel with said gate-source capacitance.

5. The improved switching DC voltage converter of claim 4, wherein:
    a further resistor having a low impedance compared to said resistor of said delay means is connected across said output of the circuit arrangement for forming the actual value of the current.

6. The improved switching DC voltage converter of claim 5, wherein:
    said further resistor has a high impedance compared to the impedance of said second electronic switch when activated.

7. The improved switching DC voltage converter of claim 6, wherein:
    said DC voltage converter is constructed as a push-pull circuit;
    said first electronic switch is connected to said current sensor together with a further electronic switch that lies in a further arm of the main power circuit;

each of said electronic switches includes a control input;
a second electronic switch is included in the circuit arrangement for the formation of the actual value of the current and is connected between said current sensor and the output of the circuit arrangement and includes a control input; and
a pair of delay elements are respectively connected between said control inputs of said first and further electronic switches and said control input of said second electronic switch.

8. The improved switching DC voltage converter of claim 1, and further comprising:
a capacitor connected across the output of the circuit arrangement for forming the actual value of the current.

* * * * *